(12) United States Patent
Jang

(10) Patent No.: US 6,910,441 B2
(45) Date of Patent: Jun. 28, 2005

(54) PRESSURE REGULATING SYSTEM OF PLASMA PROCESSING EQUIPMENT

(75) Inventor: Dong-Jun Jang, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 201 days.

(21) Appl. No.: 10/445,855

(22) Filed: May 28, 2003

(65) Prior Publication Data

US 2004/0020429 A1 Feb. 5, 2004

(30) Foreign Application Priority Data

Jul. 31, 2002 (KR) .............................. 10-2002-0045427

(51) Int. Cl.⁷ .......................... C23C 16/00; C23F 1/00; H01L 21/306
(52) U.S. Cl. .................. 118/723 R; 118/715; 118/728; 118/50; 156/345.35; 156/345.29; 156/345.33; 156/345.34; 156/345.36
(58) Field of Search ................................ 118/715, 728, 118/50; 156/345.29, 345.33–345.36

(56) References Cited

U.S. PATENT DOCUMENTS

| | | | | |
|---|---|---|---|---|
| 4,987,856 A | * | 1/1991 | Hey et al. ................. | 118/723 E |
| 5,009,738 A | * | 4/1991 | Gruenwald et al. ..... | 156/345.47 |
| 5,084,125 A | * | 1/1992 | Aoi ........................ | 156/345.31 |
| 5,091,217 A | * | 2/1992 | Hey et al. ................. | 427/248.1 |
| 5,102,523 A | * | 4/1992 | Beisswenger et al. . | 204/298.33 |
| 5,223,001 A | * | 6/1993 | Saeki ........................ | 29/25.01 |
| 5,232,508 A | * | 8/1993 | Arena et al. ................. | 118/719 |
| 5,314,574 A | * | 5/1994 | Takahashi .................... | 438/706 |
| 5,520,743 A | * | 5/1996 | Takahashi .................... | 118/730 |
| 5,574,247 A | * | 11/1996 | Nishitani et al. ........... | 118/708 |
| 5,800,667 A | * | 9/1998 | Kosaki et al. ............... | 156/382 |
| 2003/0010452 A1 | * | 1/2003 | Park et al. .............. | 156/345.33 |
| 2004/0063333 A1 | * | 4/2004 | Saigusa et al. ............. | 438/758 |
| 2004/0238123 A1 | * | 12/2004 | Becknell et al. ....... | 156/345.33 |

FOREIGN PATENT DOCUMENTS

JP 03183128 A * 8/1991 ......... H01L/21/302

* cited by examiner

Primary Examiner—Rudy Zervigon
(74) Attorney, Agent, or Firm—Volentine Francos & Whitt, pllc

(57) ABSTRACT

Plasma processing equipment includes a process, a cover covering the top of the process chamber, a wafer chuck disposed in the process chamber, a pressure regulating system including a pressure regulating plate situated at the bottom surface of the cover, and an elevating mechanism for adjusting the position of the pressure regulating plate, and a measuring device including at least one visual display for use in calibrating the pressure regulating system.

8 Claims, 6 Drawing Sheets

PRESSURE REGULATING SYSTEM OF PLASMA PROCESSING EQUIPMENT

BACKGROUND OF THE INVENTION

1. Field of the Invention

The present invention relates to equipment for processing a workpiece using plasma. More particularly, the present invention relates to a system for regulating the pressure inside a process chamber of plasma processing equipment.

2. Description of the Related Art

In general, plasma processing equipment, for example, plasma etching, chemical vapor deposition (CVD), or ashing equipment comprises a process chamber in which a vacuum is maintained, a wafer chuck disposed inside the process chamber, a cover disposed at the top of the process chamber, and an exhaust unit. A wafer is loaded on the top surface of the wafer chuck. The cover includes a shower head for injecting a reaction gas into the process chamber. The exhaust unit, on the other hand, includes a throttle valve and a vacuum pump that communicate with the process chamber at the bottom thereof. The vacuum pump generates a predetermined vacuum level within the process chamber, whereas the throttle valve is opened or closed to adjust the vacuum pressure.

Recently, a pressure regulation plate has been used to control the vacuum pressure within the process chamber. The pressure regulation plate is disposed above the wafer chuck and is supported so as to be movable up and down within the process chamber. More specifically, the width of an exhaust path within the process chamber is changed by adjusting the distance between the plate and the wafer chuck, thereby in turn controlling the pressure within the process chamber.

A cam ring moves the pressure regulation plate up and down when the cam ring is rotated. Bearings are provided at the top and bottom surface of the cam ring, respectively. The bearings contact the cam ring during the rotation of the cam ring. The bearings at the top surface of the cam ring are fixed in a position. The bearings at the bottom surface of the cam ring are moved up and down in correspondence with the shape of the cam ring as the cam ring is rotated. A supporting member links the bearings at the bottom surface of the cam ring to the pressure regulation plate, whereby the pressure regulation plate moves up and down with the bearings at the bottom surface of the cam ring.

In the conventional vacuum pressure regulator of the plasma processing equipment described above, the position of the cam ring is very important in regulating the vacuum pressure. In this respect, a tool is repeatedly inserted between the cam ring and the bearings at the top surface of the cam ring to measure the distance therebetween and thereby confirm the position of the cam ring. That is, the position of the cam ring is measured manually by an operator.

However, this operation of calibrating the cam ring is troublesome. Also, a skilled operator is required to correctly measure the position of the cam ring and adjust the cam ring accordingly.

SUMMARY OF THE INVENTION

An object of the present invention is to overcome the above-described problems of the prior art. More specifically, an object of the present invention is to provide plasma processing equipment in which the position of the cam ring can be calibrated more accurately and adjusted more easily.

To achieve the above-described object, the present invention provides plasma processing equipment comprising a measuring device including at least one visual display that displays a value indicative of the relative position of the pressure regulating plate. The plasma processing equipment may, for example, be any one of an etching, chemical vapor deposition CVD, or ashing apparatus.

The pressure regulating plate is disposed at the bottom surface of the cover of the process chamber. At least one elevating mechanism is connected to the pressure regulating plate so as to move the plate up and down above the workpiece chuck of the equipment. The elevating mechanism includes a fixed block, a first bracket mounted to the fixed block so as to be movable relative thereto, a first bearing supported by the first bracket, a second bracket supported by a lower part of the fixed block so as to be freely movable up and down, a second bearing supported on said second bracket as spaced apart from the first bearing, the aforementioned cam ring having a top surface confronting the first bearing and a bottom surface in contact with the second bearing, and a supporting member connecting the bottom of the second bracket to the pressure regulating plate.

The measuring device is operatively connected to the first bearing so as to indicate the relative position of the first bearing. Accordingly, the position of said cam ring can be determined when the first bearing is in contact with the top surface of the cam ring. To this end, the measuring device includes a moving plate connected to the first bearing so as to move up and down with the first bearing, and preferably a guide rail engaged with the plate to guide the plate as it is moved with the first bearing.

The display may be an analog display connected to the moving plate so as to display a value indicative of the position of the first bearing relative to the fixed block. The analog display preferably comprises a pointer connected with the moving plate so as to move therewith, and a scale disposed adjacent the tip of the pointer.

The display may also comprise a digital display. In this case, the digital display comprises a detector operative to detect the distance that the moving plate is moved relative to a reference position and to output an analog signal indicative of that distance, an A/D converter connected to the detector so as to convert the analog signal to a digital signal, a digital display device, and a controller. The controller is connected to the A/D converter and to the digital display device so as to receive the digital signal from the A/D converter and output the digital signal to the digital display device.

The digital display is preferably a liquid crystal display (LCD) or a light-emitting diode (LED).

BRIEF DESCRIPTION OF THE DRAWINGS

These and other objects, features and advantages of the present invention will be better understood from the following detailed descriptions thereof made in conjunction with the accompanying drawings, in which like reference numerals denote like parts, and in which.

DETAILED DESCRIPTION OF THE PREFFERED EMBODIMENTS

Figure 1:
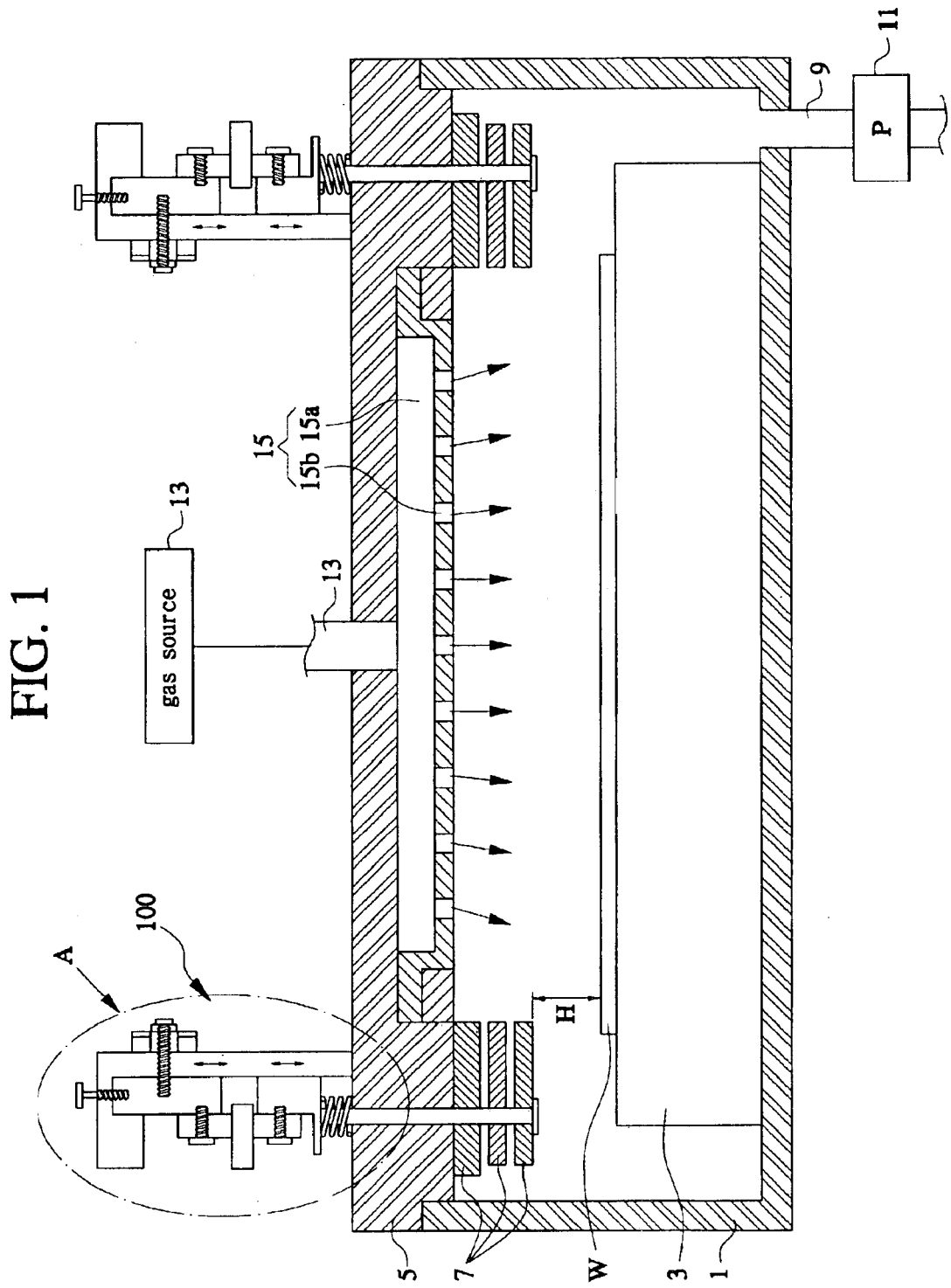
FIG. 1 is a schematic diagram of plasma processing equipment according to the present invention.

As shown in FIG. 1, plasma processing equipment of the present invention comprises a process chamber 1, a wafer chuck 3, a cover 5, a pressure regulating plate 7, an exhaust unit including a vacuum pump 11, a gas supply unit 13, a shower head 15, and an elevating mechanism 100. The process chamber 1 defines a space in which a vacuum is created. The wafer chuck 3 is disposed within this space and an object to be processed, such as a wafer W, is supported on the top surface of the wafer chuck 3. The cover 5 covers the top of the process chamber 1. The vacuum pump 11 is connected with an exhaust line 9 that opens into the bottom of the process chamber 1.

The gas supply unit 13 is connected to the cover 5, and includes a gas source from which a reaction gas is supplied into the process chamber 1. A shower head 15 having a plurality of gas injection holes 15b is mounted to the bottom of the cover 5. The shower head 15 also defines a gas storage area 15a into which the reaction gas from the gas supply unit 13 flows before being injected into the process chamber 1.

The pressure regulating plate 7 is an annular structure supported at the bottom of the cover 5. The pressure regulating plate 7 is moved up and down by the elevating mechanism 100 to control the vacuum pressure exerted on the wafer W. More specifically, a passageway through which gas is exhausted is defined by and between the plate 7 closest to the wafer chuck 3. The passageway has an effective width "H", namely the distance between the plate 7 and the wafer chuck 3. That is, the vacuum pressure exerted on the water W depends on the distance "H" between the plate 7 and the wafer chuck 3. The pressure regulating plate 7 is moved up or down to vary the distance "H" between the plate 7 and the wafer chuck 3, thereby in turn controlling the vacuum pressure exerted on the wafer W.

Figure 2:
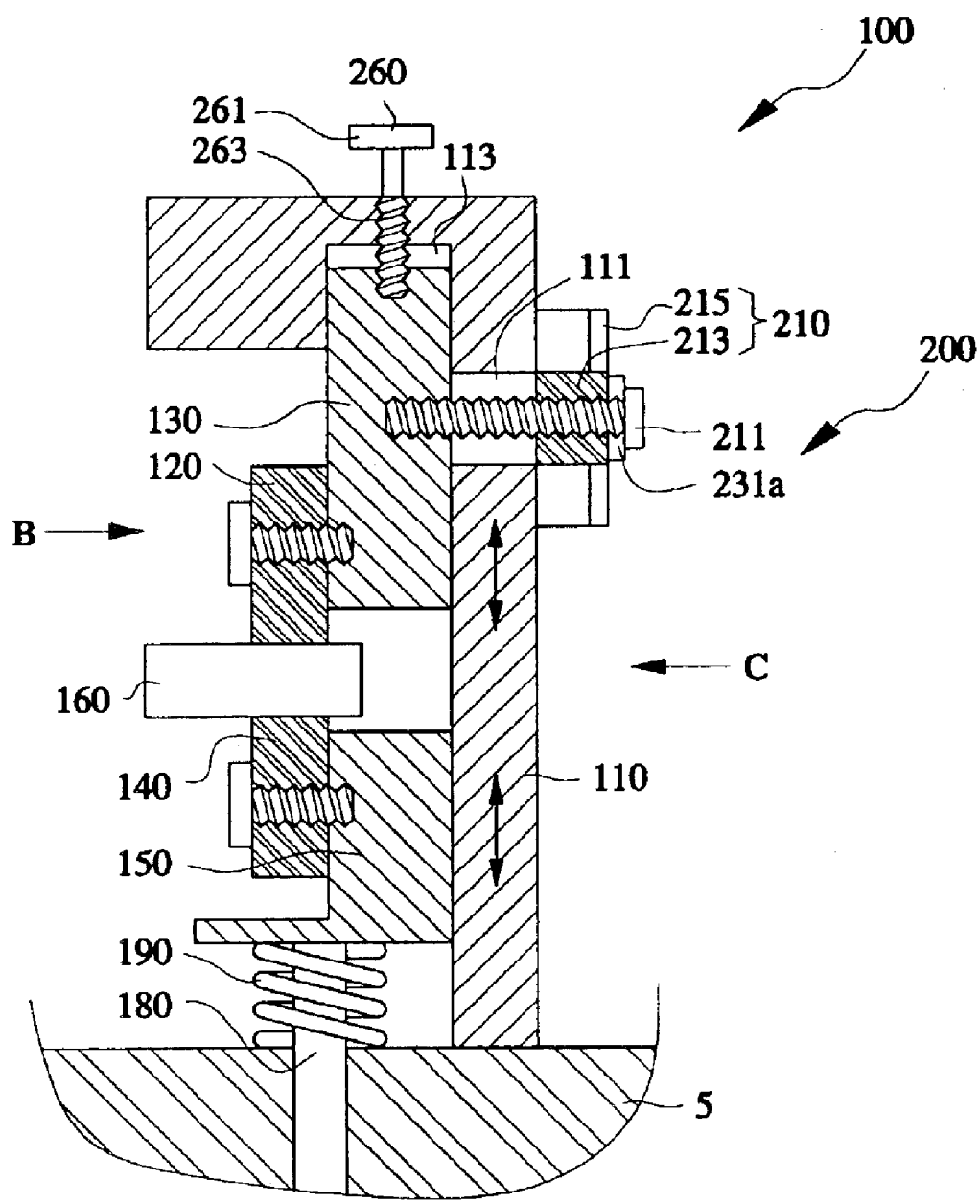
FIG. 2 is an enlarged view of the area "A" of FIG. 1, showing a driver of an elevating mechanism of the plasma processing equipment.
Figure 3:
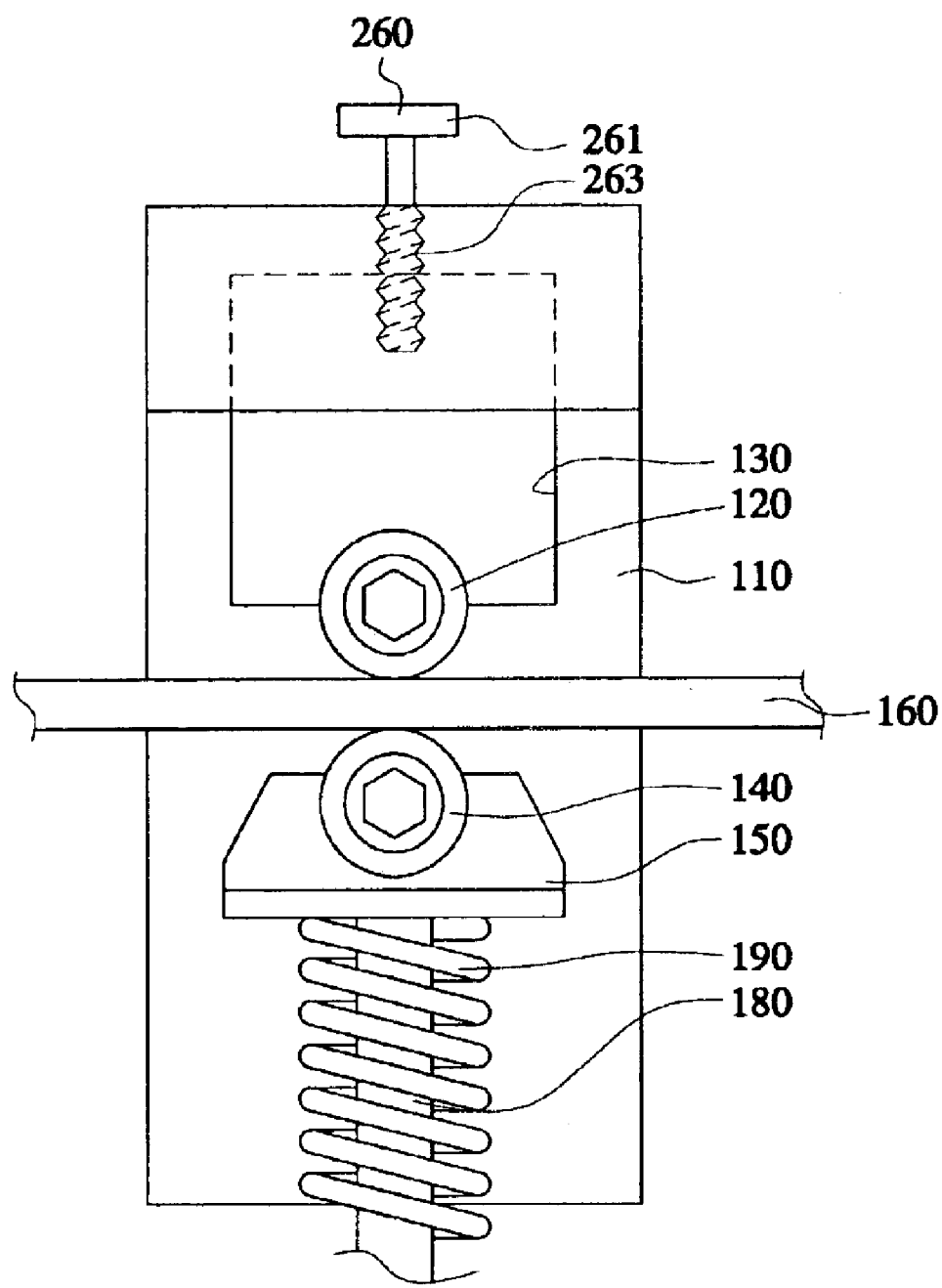
FIG. 3 is a side view of the driver taken in the direction of arrow B of FIG. 2.

As shown in FIG. 1, the elevating mechanism 100 comprises a plurality of drivers mounted on top of the cover 5. As best shown in FIGS. 2 and 3, each of the drivers comprises a fixed block 110, a first bracket 130, a second bracket 150, a cam ring 160, and a longitudinal supporting member 180. The fixed block 110 is fixed to the top of the cover 5, and the first bracket 130 is installed on a top portion of fixed block 110 in an adjustable manner. The first bracket 130 supports a first bearing 120. On the other hand, the second bracket 150 is installed on a bottom portion of the fixed block 110 so as to be freely movable up and down relative to the fixed block 110. The second bracket 150 supports a second bearing 140 as spaced apart from the first bearing 120.

Figure 5:
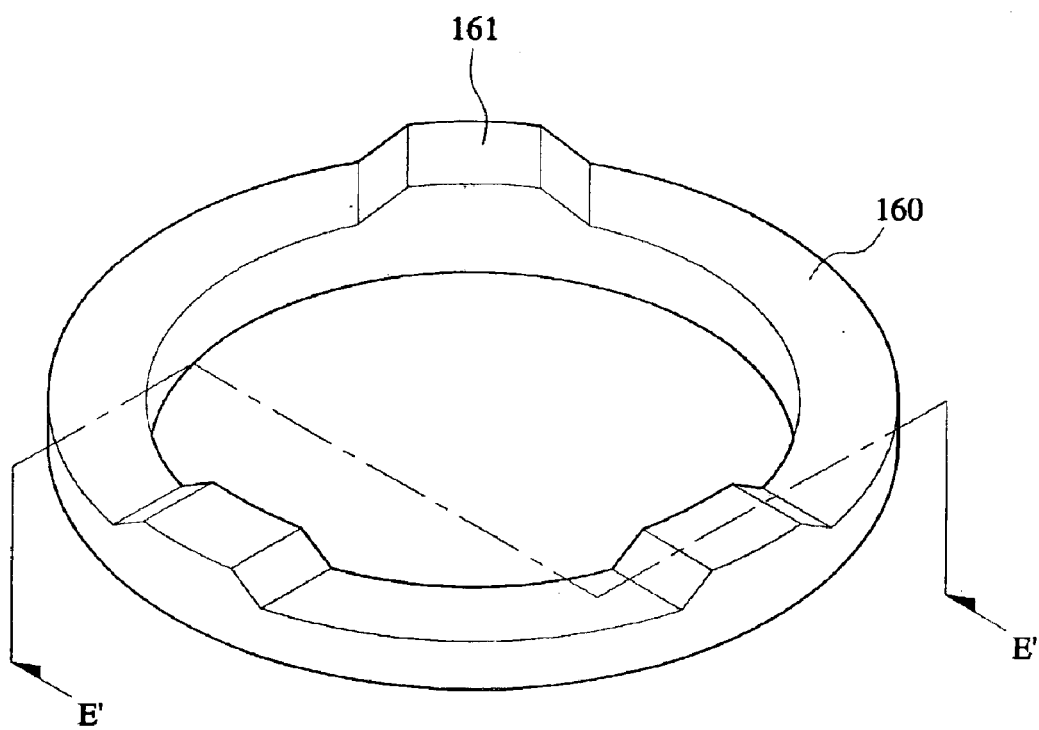
FIG. 5 is a perspective view of the bottom of a cam ring of the elevating mechanism, as taken from the bottom thereof.
Figure 6:
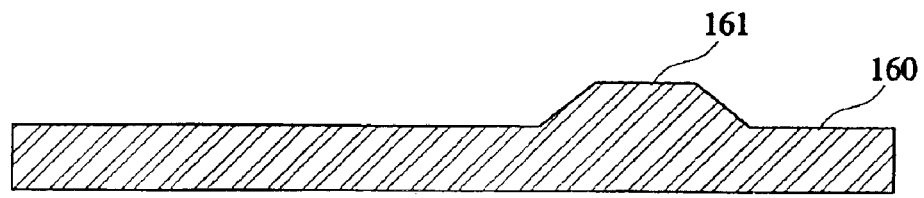
FIG. 6 is a cross-sectional view of the cam ring taken along line E'—E' of FIG. 5.

Referring to FIGS. 5 and 6, the cam ring 160 has a flat upper surface and a plurality of protrusions 161 at the bottom surface thereof. Referring again to FIGS. 1–3, whereas the top surface of the cam ring 160 faces the first bearing 120, the bottom surface of the cam ring 160 contacts the second bearing 140. The cam ring 160 is supported by and rotated in a predetermined direction by a driver (not shown). When a protrusion 161 comes into contact with a second bearing 140, the second bracket 150 is moved down along with the second bearing 140.

The supporting member 180 is connected with the bottom of the second bracket 150 and supports the pressure regulating plate 7. A resilient member 190 is connected with the bottom of the second bracket 150 to support the second bracket 150 elastically, i.e., to exert a biasing force that urges the second bracket 150 upwardly. For example, the resilient member 190 is as a helical spring surrounding the supporting member 180 as interposed between the bottom of the second bracket 150 and the top of the cover 5. Therefore, when a protrusion 161 of the cam ring 160 comes into contact with a second bearing 140, the second bracket 150 and the supporting member 180 connected therewith are moved down to force the pressure regulating plate 7 down.

Figure 4:
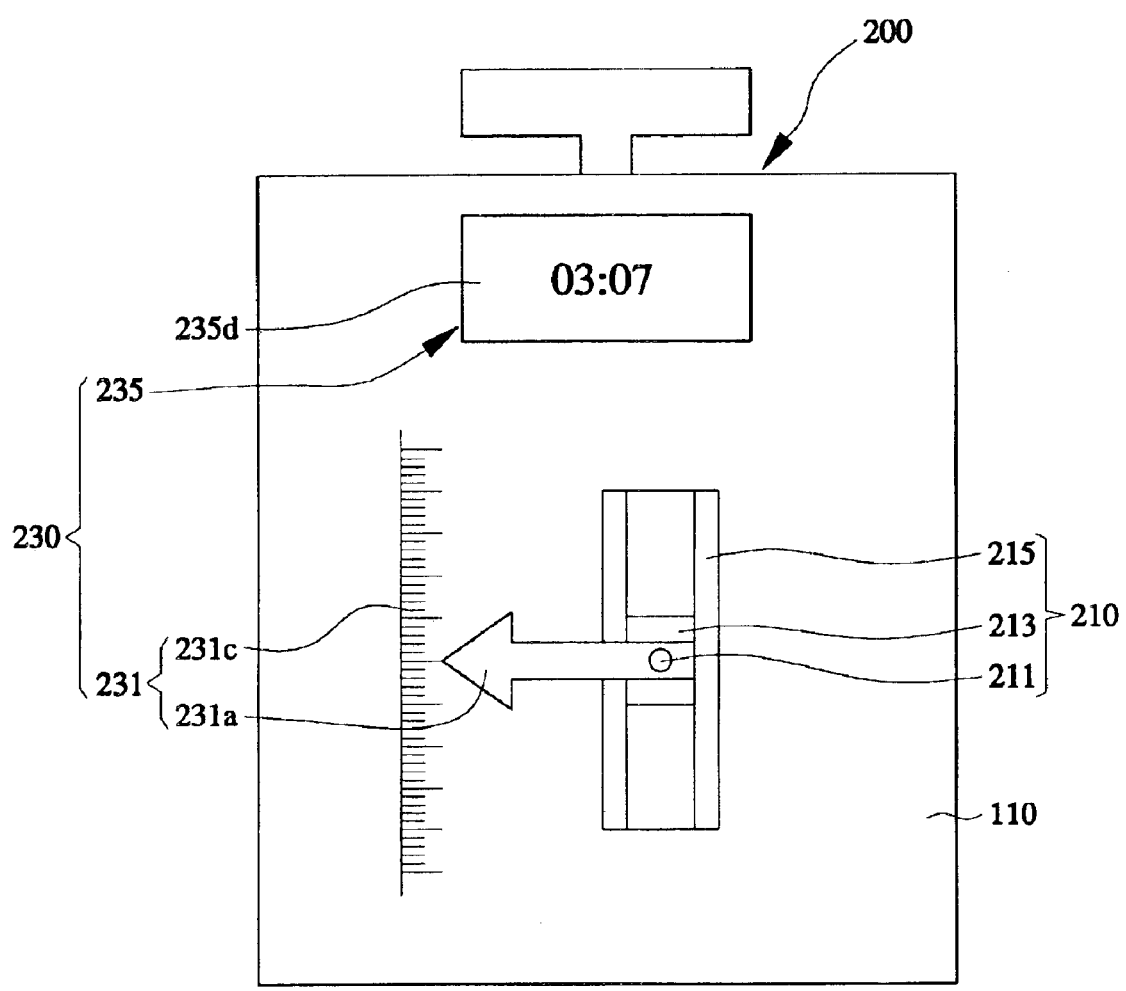
FIG. 4 is a side view of the driver taken in the direction of arrow C of FIG. 2.

As shown in FIGS. 2 and 4, the plasma processing equipment of the present invention further comprises a measuring device 200 disposed at one side of the fixed block 110. The measuring device 200 is operative to indicate the setting position of the first bearing 120. The setting position is the home position of the cam ring 160. That correspond to a reference position of the cam ring 160. The measuring device 200 comprises a moving unit 210 connected with the first bearing 120 so as to move up and down therewith, and a distance displayer 230 that displays the relative position of the moving unit 210 and hence, the setting position of the first bearing 120.

The moving unit 210 includes a moving plate 213, a connector 211 by and through which the moving plate 213 is fixed to the first bearing 120, and a guide rail 215 supporting the moving plate 213 for sliding movement relative to the fixed block 110. The fixed block 110 has a recess 111 extending therethrough 111, the recess 111 being elongate in a vertical direction. The connector 211 extends through the elongate recess 111 and is free to move up and down therein. The fixed block 110 also has a cavity 113 in which the first bracket 130 is received and guided for vertical sliding movement relative to the fixed block 110.

A regulator 260 extends through the top of the fixed block 110 and is connected with the first bracket 130. The regulator 260 can be manipulated to move the first bracket 130 up and down. For example, the regulator 260 preferably comprises a handle 261 and a moving member 263 that moves the first bracket vertically when the handle 261 is manipulated. More specifically, the regulator 260 may be a threaded fastener, wherein the handle 261 comprises the head of the fastener and the moving member 263 comprises the shaft of the fastener threaded to the fixed block 110 and/or the first bracket 130.

As shown in FIG. 4, the distance displayer 230 comprises an analog display 231 and a digital display 235. The analog display 231 includes a pointer 231a connected with the moving plate 213, and a scale 231c provided adjacent the pointer and on the same surface along which the pointer 231a moves.

Figure 7:
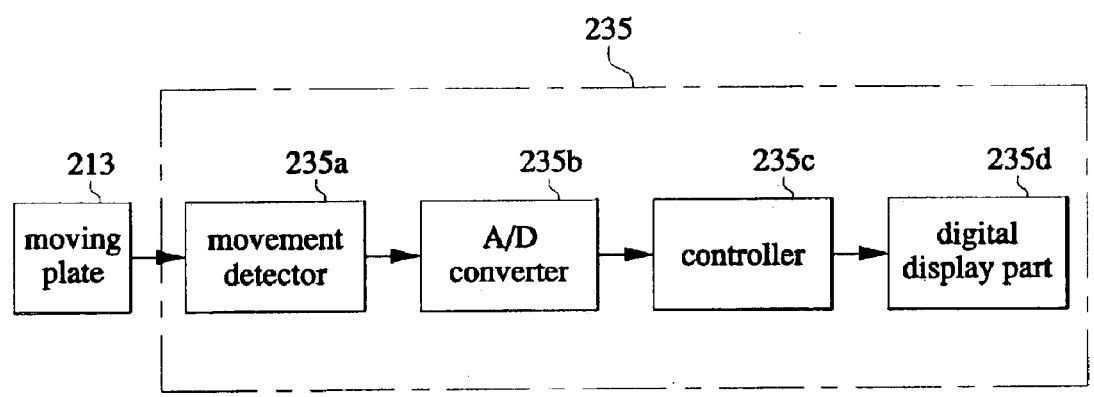
FIG. 7 is a block diagram of a digital display unit of the elevating mechanism of the plasma processing equipment according to the present invention.

As shown in FIG. 7, the digital display 235 includes a movement detector 235a, an A/D converter 235b, a controller 235c, and a digital display part 235d. The movement detector 235a detects the movement of the moving plate 213 and issues an analog signal indicative of the distance the plate 231 has moved from a reference position, and the A/D converter 235b converts the analog signal to a digital signal. The controller 235c receives the digital signal produced by the A/D converter 235b, and outputs the digital signal to the digital display part 235d. The digital display 235d can be any one of various types of display devices, such as a liquid crystal display (LCD) or a light-emitting diode (LED).

The operation of the vacuum pressure regulator will now be described in more detail. In particular, the operation of measuring the the setting position of the first bearing 120 will be described in more detail.

At first, an operator determines a set position of the cam ring 160, this position being one of the important factors in controlling the level of vacuum pressure experienced by the wafer W. More specifically, the setting position of the first bearing 120 is measured. The pressure regulating plate 7 may be placed in any one of several positions, for example three positions, within the process chamber 3. The vacuum pressure exerted on the wafer W is different when the pressure regulation plate 7 is in each of the positions, respectively. Accordingly, the setting position of the first bearing 120 is compensated for at each of such positions so that a desired homogeneous vacuum pressure is created.

More specifically, as shown in FIG. 4, the pointer 231a indicates a value of the scale 231c corresponding to the position of the first bearing 120. At this moment, the digital display 235d displays the value in digital numerical form, so that an operator can easily confirm the. Setting position of the first bearing 120 That is, as shown in FIG. 7 the movement detector 235a detects the relative position of the moving plate 213 linked with the pointer 231a and issues an analog electric signal indicative thereof, and the A/D converter converts the analog electric signal to a digital signal and transmits the analog signal to the controller 235c. The controller 235c outputs the digital signal to the digital display 235d as a digital numerical value.

Next, the operator moves the first bracket 130 up or down to compensate for the position that the first bearing 120 comes in contact with the cam ring 160, namely for the setting position of the first bearing 120 as indicated by the pointer 231a or the digital display device 235d. As a result, the position of the pointer 231a is changed and a new value of the scale 231c is indicated. The new value is used for calibrating the pressure regulating plate 7.

In the case of the conventional vacuum pressure regulator of plasma processing equipment, the operator measures the position of the first bearing relative to the upper surface of the cam ring and adjusts the bearing based on his/her own skill. However, according to the present invention, the operator can accurately determine the position of the first bearing 120 based on the accurate scale or digital numerical value. Therefore, even a relatively unskilled operator can be used to adjust the position of the bearing 120.

Finally, although the present invention has been particularly shown and described with reference to the preferred embodiments thereof, various changes in form and details, as will be apparent to those skilled in the art that, may be made to the preferred embodiments without departing from the true spirit and scope of the invention as defined by the appended claims.

What is claimed is:

1. Plasma processing equipment comprising: a process chamber; an exhaust system connected to said process chamber so as to exhaust gas from said chamber and thereby create a vacuum within said chamber; a cover covering the top of said process chamber; a workpiece chuck disposed in said process chamber so as to support an object to be processed thereon; a pressure regulating plate disposed at the bottom of said cover above said workpiece chuck in said pressure chamber; at least one elevating mechanism connected to said pressure regulating plate so as to move said plate up and down above said chuck in said process chamber, said elevating mechanism including a fixed block fixed to the top of said cover, a first bracket supported by said fixed block such that the position of said first bracket relative to said fixed block can be adjusted in a vertical direction, a first bearing supported by said first bracket so as to be movable therewith relative to said fixed block, a second bracket supported by said fixed block below said first bracket and mounted to said fixed block so as to be freely movable up and down, a second bearing supported by said second bracket as spaced apart from said first bearing, a cam ring supported so as to be rotatable about a central axis thereof, said cam ring having a top surface confronting said first bearing and a bottom surface contacting said second bearing, and a protrusion at said bottom surface, whereby rotation of said cam ring about the central axis thereof moves said protrusion in and out of contact with said second bearing, and a supporting member connected to and extending longitudinally between the bottom of said second bracket and said pressure regulation plate so as to move with said second bracket and thereby position said pressure regulation plate above said chuck within said process chamber; and a measuring device including at least one visual display operatively connected to said first bearing so as to indicate the relative position of said first bearing, whereby the position of said cam ring can be determined when said first bearing is in contact with the top surface of said cam ring.

2. Plasma processing equipment according to claim 1, wherein said measuring device comprises a moving plate connected to said first bearing so as to move up and down with said first bearing, said at least one visual display being operatively connected to said moving plate so as to display a value indicative of the position of said first bearing relative to said fixed block.

3. Plasma processing equipment according to claim 2, wherein said measuring device further includes a guide rail supporting said moving plate and engaged therewith to guide said moving plate as said moving plate is moved with said first bearing.

4. Plasma processing equipment according to claim 2, wherein said at least one visual display is an analog display.

5. Plasma processing equipment according to claim 4, wherein said analog visual display comprises a pointer connected with said moving plate, and a scale disposed adjacent said pointer.

6. Plasma processing equipment according to claim 2, wherein said at least one visual display is a digital display.

7. Plasma processing equipment according to claim 6, wherein said digital display comprises a detector operative to detect the distance that said moving plate is moved relative to a reference position and to output an analog signal indicative of said distance, an A/D converter connected to said detector so as to convert the analog signal to a digital signal, a digital display part, and a controller connected to said A/D converter and to said digital display device so as to receive the digital signal from the A/D converter and output the digital signal to said digital display part.

8. Plasma processing equipment according to claim 1, wherein said at least one visual display includes both an analog display and a digital display.

* * * * *